US011482491B2

(12) United States Patent
Chen et al.

(10) Patent No.: US 11,482,491 B2
(45) Date of Patent: Oct. 25, 2022

(54) PACKAGE STRUCTURE WITH POROUS CONDUCTIVE STRUCTURE AND MANUFACTURING METHOD THEREOF

(71) Applicant: Taiwan Semiconductor Manufacturing Co., Ltd., Hsinchu (TW)

(72) Inventors: Wei-Yu Chen, Taipei (TW); Chih-Hua Chen, Hsinchu County (TW); Ching-Hua Hsieh, Hsinchu (TW); Hsiu-Jen Lin, Hsinchu County (TW); Yu-Chih Huang, Hsinchu (TW); Yu-Peng Tsai, Taipei (TW); Chia-Shen Cheng, Hsinchu County (TW); Chih-Chiang Tsao, Taoyuan (TW); Jen-Jui Yu, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 592 days.

(21) Appl. No.: 15/877,398

(22) Filed: Jan. 23, 2018

(65) Prior Publication Data
US 2019/0139886 A1 May 9, 2019

Related U.S. Application Data

(60) Provisional application No. 62/582,957, filed on Nov. 8, 2017.

(51) Int. Cl.
*H01L 23/528* (2006.01)
*H01L 23/31* (2006.01)
(Continued)

(52) U.S. Cl.
CPC .......... *H01L 23/528* (2013.01); *H01L 21/486* (2013.01); *H01L 21/4853* (2013.01);
(Continued)

(58) Field of Classification Search
CPC . H01L 21/4853; H01L 21/486; H01L 21/568; H01L 23/3114; H01L 23/5226;
(Continued)

(56) References Cited

U.S. PATENT DOCUMENTS 8,815,648 B1 * 8/2014 Aoya ................. H01L 21/4867
438/123
9,000,584 B2 4/2015 Lin et al.
(Continued)

*Primary Examiner* — Scott B Geyer
(74) *Attorney, Agent, or Firm* — JCIPRNET

(57) ABSTRACT

A package structure includes an insulating encapsulation, at least one die, and conductive structures. The at least one die is encapsulated in the insulating encapsulation. The conductive structures are located aside of the at least one die and surrounded by the insulating encapsulation, and at least one of the conductive structures is electrically connected to the at least one die. Each of the conductive structures has a first surface, a second surface opposite to the first surface and a slant sidewall connecting the first surface and the second surface, and each of the conductive structures has a top diameter greater than a bottom diameter thereof, and wherein each of the conductive structures has a plurality of pores distributed therein.

10 Claims, 20 Drawing Sheets

(51) Int. Cl.
*H01L 23/00* (2006.01)
*H01L 21/56* (2006.01)
*H01L 21/48* (2006.01)
*H01L 23/522* (2006.01)
*H01L 23/538* (2006.01)
*H01L 21/683* (2006.01)

(52) U.S. Cl.
CPC ........ *H01L 21/568* (2013.01); *H01L 21/6835* (2013.01); *H01L 23/3114* (2013.01); *H01L 23/5226* (2013.01); *H01L 23/5389* (2013.01); *H01L 24/03* (2013.01); *H01L 24/09* (2013.01); *H01L 24/81* (2013.01); *H01L 23/3128* (2013.01); *H01L 2221/68345* (2013.01); *H01L 2221/68359* (2013.01); *H01L 2224/02331* (2013.01); *H01L 2224/02379* (2013.01); *H01L 2224/18* (2013.01); *H01L 2224/73267* (2013.01); *H01L 2924/37001* (2013.01)

(58) Field of Classification Search
CPC ....... H01L 23/528; H01L 24/03; H01L 24/09; H01L 24/81; H01L 2224/02331; H01L 2224/02379; H01L 23/49827; H01L 23/31–3135; H01L 23/3157; H01L 21/56; H01L 23/481; H01L 21/76898; H01L 2225/06541–06544; H01L 2224/023–024; H01L 2225/06548
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,515,068 B1* | 12/2016 | Patterson | H01L 27/0688 |
| 9,881,909 B2* | 1/2018 | Bauer | H01L 23/485 |
| 2010/0044885 A1* | 2/2010 | Fuergut | H01L 23/5389 257/784 |
| 2012/0214302 A1* | 8/2012 | Jeong | H01L 23/49827 257/E21.589 |
| 2012/0319254 A1* | 12/2012 | Kikuchi | H05K 1/186 257/659 |
| 2013/0075924 A1* | 3/2013 | Lin | H01L 23/293 257/774 |
| 2014/0353823 A1* | 12/2014 | Park | H01L 24/14 257/737 |
| 2016/0218056 A1* | 7/2016 | Lu | H01L 23/49827 |
| 2016/0284642 A1* | 9/2016 | Ganesan | H01L 23/5226 |
| 2017/0011960 A1* | 1/2017 | Ko | H01L 21/76843 |
| 2018/0102322 A1* | 4/2018 | Kang | H01L 23/5383 |

* cited by examiner

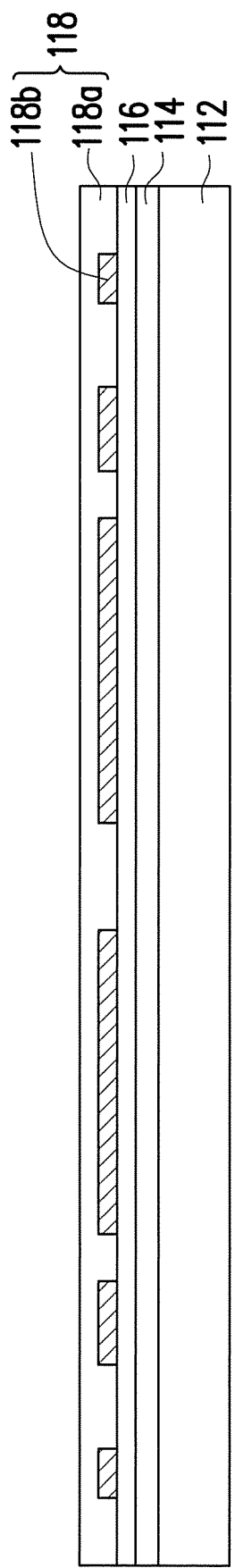
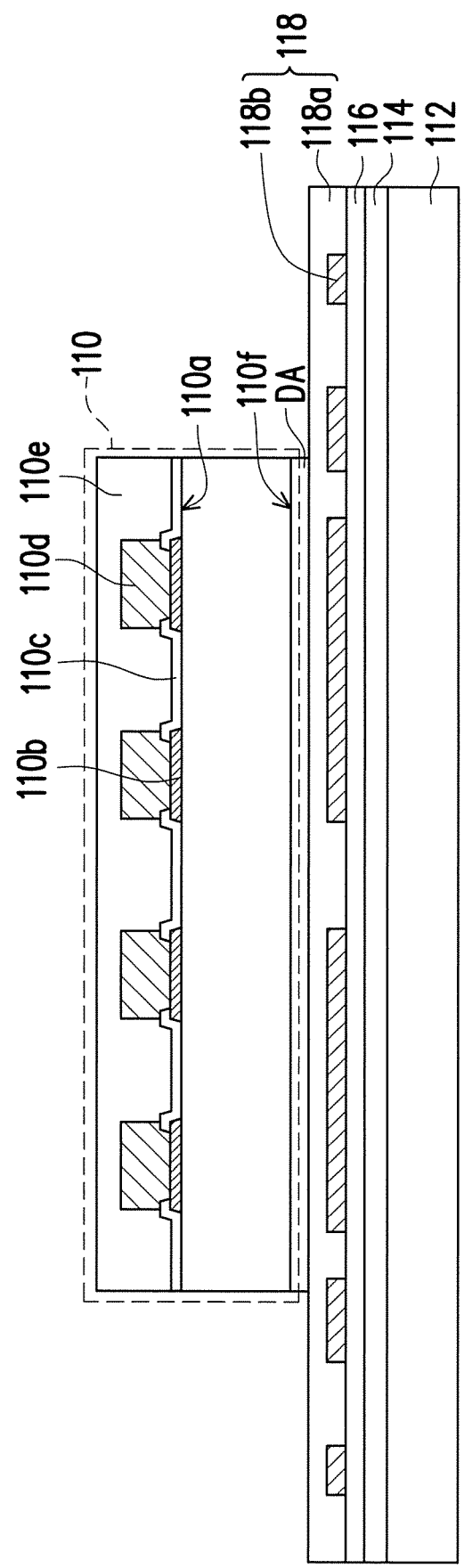
FIG. 1
FIG. 2

PACKAGE STRUCTURE WITH POROUS CONDUCTIVE STRUCTURE AND MANUFACTURING METHOD THEREOF

CROSS-REFERENCE TO RELATED APPLICATION

This application claims the priority benefit of U.S. provisional application Ser. No. 62/582,957, filed on Nov. 8, 2017. The entirety of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices or dies at the wafer level, and various technologies have been developed for the wafer level packaging. Currently, integrated fan-out packages are becoming increasingly popular for their compactness. The improved routing capability and reliability provided by the integrated fan-out packages are key factors for future packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 10 are schematic cross-sectional views of various stages in a manufacturing method of a package structure according to some exemplary embodiments of the present disclosure.

DETAILED DESCRIPTION

Figure 3:
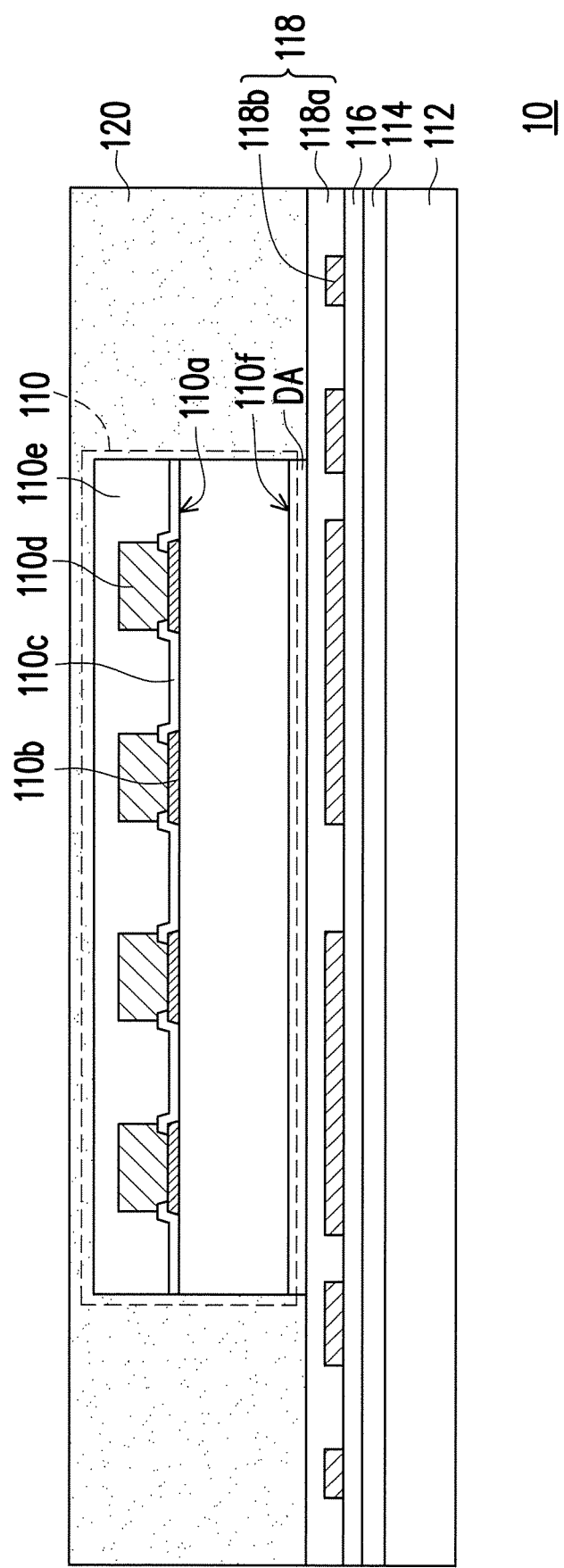

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 are schematic cross-sectional views of various stages in a manufacturing method of a package structure according to some exemplary embodiments of the present disclosure. FIG. 11 is a schematic cross-sectional view of a conductive structure included in a package structure according to some exemplary embodiments of the present disclosure. In exemplary embodiments, the manufacturing method is part of a wafer level packaging process. In FIG. 1 to FIG. 10, one die is shown to represent plural dies of the wafer, and a package structure 10 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Referring to FIG. 1, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) or an adhesive layer (such as a ultra-violet curable adhesive or a heat curable adhesive layer).

As shown in FIG. 1, in some embodiments, the buffer layer 116 is disposed on the debond layer 114, and the debond layer 114 is located between the carrier 112 and the buffer layer 116. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity.

In some embodiments, as shown in FIG. 1, a redistribution layer 118 is formed over the carrier 112. For example, in FIG. 1, the redistribution layer 118 is formed on the buffer layer 116, and the formation of the redistribution layer 118 includes sequentially forming one or more polymer dielectric layers 118a and one or more metallization layers 118b in alternation. In some embodiments, the redistribution layer 118 includes one polymer dielectric layer 118a and one metallization layer 118b as shown in FIG. 1; however, the disclosure is not limited thereto. The numbers of the metallization layers and the polymer dielectric layers included in the redistribution layer 118 is not limited thereto. For example, the numbers of the metallization layers and the polymer dielectric layers may be one or more than one. Due to the configuration of the polymer dielectric layer 118a and the metallization layer 118b, a routing function is provided to the package structure 10.

In certain embodiments, as shown in FIG. 1, the metallization layer 118b is disposed on the buffer layer 116 and covered by the polymer dielectric layer 118a. In some embodiments, the material of the polymer dielectric layer 118a may include polyimide, epoxy resin, acrylic resin, phenol resin, benzocyclobutene (BCB), polybenzoxazole (PBO), or any other suitable polymer-based dielectric material, and the polymer dielectric layer 118a may be formed by deposition. In some embodiments, the material of the metallization layer 118b may include aluminum, titanium, copper, nickel, tungsten, and/or alloys thereof, and the metallization layer 118b may be formed by electroplating or deposition. The disclosure is not limited thereto.

Referring to FIG. 2, in some embodiments, at least one semiconductor die 110 is provided. In some embodiments, the semiconductor die 110 is disposed on the redistribution layer 118 through a die attach film DA. In certain embodiments, the die attach film DA is first disposed on a backside 110f of the semiconductor die 110, then the semiconductor die 110 is attached to the redistribution layer 118 by placing the die attach film DA between the semiconductor die 110 and the redistribution layer 118. With the die attach film DA, a better adhesion between the semiconductor die 110 and the redistribution layer 118 is ensured. For example, in FIG. 2, the backside 110f of the semiconductor die 110 is stably adhered to the redistribution layer 118 through the die attach film DA provided between the semiconductor die 110 and the redistribution layer 118. In some embodiments, the redistribution layer 118 is referred as a back-side redistribution layer of the semiconductor die 110.

In some embodiments, the semiconductor die 110 includes an active surface 110a, a plurality of pads 110b distributed on the active surface 110a, a passivation layer 110c covering the active surface 110a and a portion of the pads 110b, a plurality of conductive pillars 110d connected to the portion of the pads 110b being exposed, a protection layer 110e, and the backside 110f opposite to the active surface 110a. As shown in FIG. 2, for example, the pads 110b are partially exposed by the passivation layer 110c, the conductive pillars 110d are disposed on and electrically connected to the pads 110b, and the protection layer 110e covers the passivation layer 110c and the conductive pillars 110d, as shown in FIG. 2. In some embodiments, the pads 110b may be aluminum pads or other suitable metal pads. In some embodiments, the conductive pillars 110d are copper pillars, copper alloy pillar or other suitable metal pillars, for example. In some embodiments, the passivation layer 110c and/or the protection layer 110e may be a polybenzoxazole (PBO) layer, a polyimide (PI) layer or other suitable polymers. In some alternative embodiments, the passivation layer 110c and/or the protection layer 110e may be made of inorganic materials, such as silicon oxide, silicon nitride, silicon oxynitride, or any suitable dielectric material. In certain embodiments, the materials of the passivation layer 110c and the protection layer 110e may be the same or different, the disclosure is not limited thereto. In an alternative embodiment, the semiconductor die 110 may include the active surface 110a, the pads 110b distributed on the active surface 110a, the passivation layer 110c covering the active surface 110a and a portion of the pad 110b, and the backside surface 110f opposite to the active surface 110a.

It is noted that, the semiconductor die 110 described herein may be referred as a chip or an integrated circuit (IC). In an alternative embodiment, the semiconductor die 110 described herein may be semiconductor devices. In certain embodiments, the semiconductor die 110 may include one or more digital chips, analog chips or mixed signal chips, such as application-specific integrated circuit ("ASIC") chips, sensor chips, wireless and radio frequency (RF) chips, memory chips, logic chips or voltage regulator chips. In certain embodiments, the semiconductor die 110 may further include additional semiconductor die(s) of the same type or different types. In an alternative embodiment, the additional semiconductor die(s) may include digital chips, analog chips or mixed signal chips, such as ASIC chips, sensor chips, wireless and RF chips, memory chips, logic chips or voltage regulator chips. The disclosure is not limited thereto.

Referring to FIG. 3, in some embodiments, the semiconductor die 110 is encapsulated in the insulating encapsulation 120. In some embodiments, the insulating encapsulation 120 covers the semiconductor die 110, where the semiconductor die 110 are not accessibly revealed by the insulating encapsulation 120. In some embodiments, the insulating encapsulation 120 is formed over the semiconductor die 110 and the redistribution layer 118. For example, as shown in FIG. 3, the insulating encapsulation 120 covers the semiconductor die 110 and a surface of the redistribution layer 118 exposed by the semiconductor die 110. In other words, the insulating encapsulation 120 is over-molded over the semiconductor die 110 and the redistribution layer 118, where a height of the insulating encapsulation 120 is greater than a height of the semiconductor die 110.

In one embodiment, the material of the insulating encapsulation 120 includes epoxy resins, phenolic resins or silicon-containing resins, or any suitable materials, for example. In an alternative embodiment, the insulating encapsulation 120 may include any insulating encapsulation material that is able to be patterned by suitable patterning processes. In some embodiments, the insulating encapsulation 120 may further include inorganic filler or inorganic compound (e.g. silica, clay, and so on) which can be added therein to optimize coefficient of thermal expansion (CTE) of the insulating encapsulation 120. The disclosure is not limited thereto.

Figure 4:
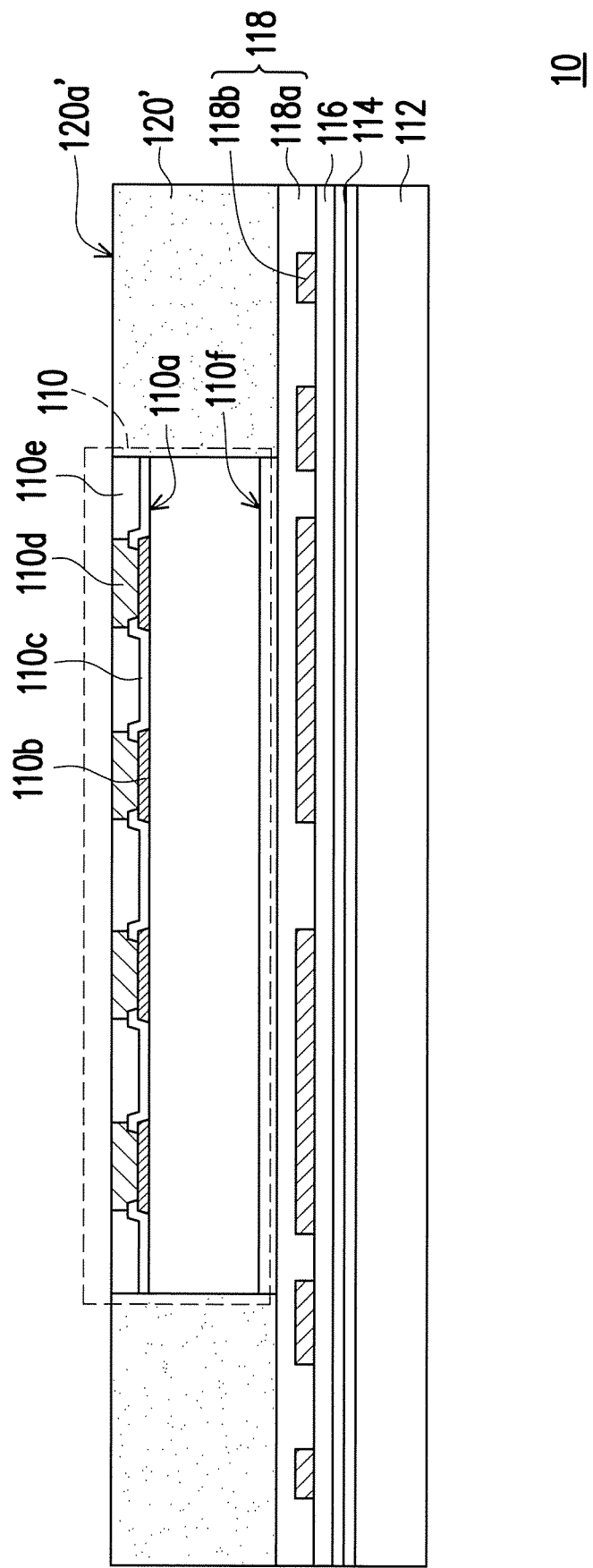

Referring to FIG. 4, in some embodiments, the insulating encapsulation 120 is planarized to form an insulating encapsulation 120' exposing the conductive pillars 110d and the protection layer 110e of the semiconductor die 110. In some embodiments, the insulating encapsulation 120 and a portion of the protection layer 110e of the semiconductor die 110 are planarized until top surfaces of the conductive pillars 110d of the semiconductor die 110 are exposed. During the planarizing step, the conductive pillars 110d of the semiconductor die 110 may also, for example, be partially removed. As shown in FIG. 4, for example, the top surfaces of the conductive pillars 110d and the protection layer 110e of the semiconductor die 110 are exposed by a top surface 120a' of the insulating encapsulation 120'. In certain embodiments, after the planarization, the top surfaces of the conductive pillars 110d and the protection layer 110e of the semiconductor die 110 become substantially levelled with the top surface 120a' of the insulating encapsulation 120'. In other words, the top surfaces of the conductive pillars 110d and the protection layer 110e of the semiconductor die 110 are coplanar to the top surface 120a' of the insulating encapsulation 120'.

In some embodiments, the insulating encapsulation 120 and the conductive pillars 110d and the protection layer 110e of the semiconductor die 110 are planarized through a grinding process or a chemical mechanical polishing (CMP) process. After the planarizing step, a cleaning step may be optionally performed, for example to clean and remove the residue generated from the planarizing step. However, the disclosure is not limited thereto, and the planarizing step may be performed through any other suitable method. The disclosure is not limited thereto.

Figure 5:
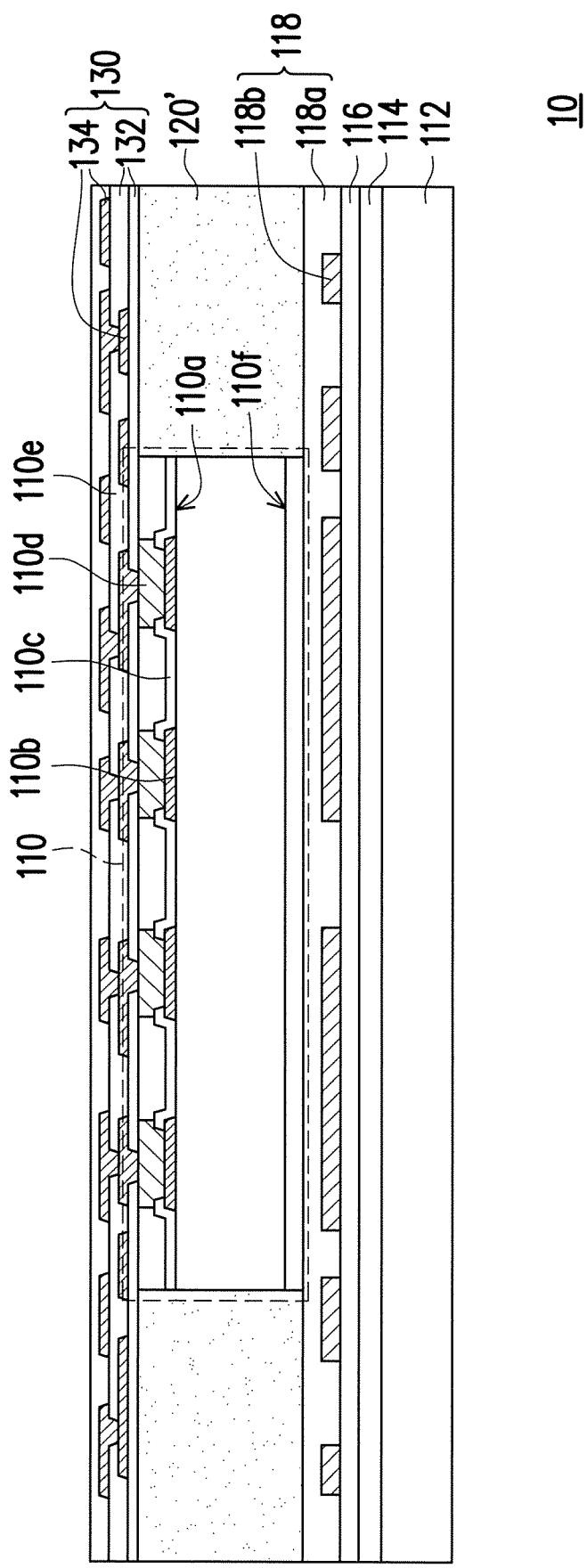

Referring to FIG. 5, in some embodiments, a redistribution layer 130 is formed over the carrier 112. In some embodiments, the redistribution layer 130 is formed on the top surfaces of the conductive pillars 110d and the protection layer 110e of the semiconductor die 110 and the top surface 120a' of the insulating encapsulation 120'. In certain embodiments, the redistribution layer 130 is mechanically and electrically connected to the conductive pillars 110d of the semiconductor die 110, wherein the redistribution layer 130 provides a routing function for the semiconductor die 110. In some embodiments, the redistribution circuit structure 130 is a front-side redistribution layer electrically connected to the semiconductor die 110.

The formation of the first redistribution layer 130 includes sequentially forming one or more polymer dielectric layers 132 and one or more metallization layers 134 in alternation. In certain embodiments, as shown in FIG. 5, the metallization layers 134 are sandwiched between the polymer dielectric layers 132, where the top surface of the topmost layer of the metallization layers 134 is covered by the topmost layer of the polymer dielectric layers 132 and the lowest layer of the metallization layers 134 is exposed by the lowest layer of the polymer dielectric layers 132 to connect the conductive pillars 110d of the semiconductor die 110. In some embodiments, the material of the polymer dielectric layers 132 includes polyimide, epoxy resin, acrylic resin, phenol resin, benzocyclobutene (BCB), polybenzooxazole (PBO), or any other suitable polymer-based dielectric material, and the polymer dielectric layers 132 may be formed by deposition. In some embodiments, the material of the metallization layers 134 includes aluminum, titanium, copper, nickel, tungsten, and/or alloys thereof, and the metallization layers 134 may be formed by electroplating or deposition. The numbers of the metallization layers and the polymer dielectric layers included in the redistribution layer 130 is not limited according to the disclosure. In one embodiment, the formation and material of the redistribution layer 130 may be the same as that of the redistribution layer 118. In an alternative embodiment, the formation and material of the redistribution layer 130 may be the different from that of the redistribution layer 118.

Figure 6:
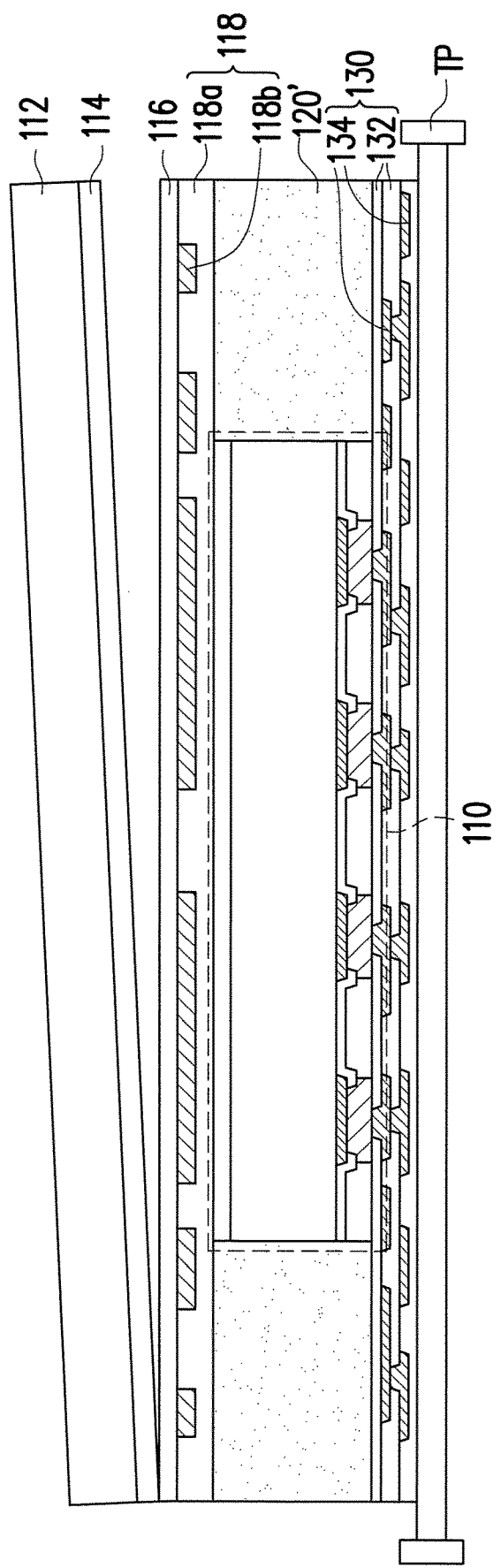

Referring to FIG. 6, in some embodiments, the whole structure along with the carrier 112 is flipped (turned upside down) and then the carrier 112 is debonded from the buffer layer 116. In some embodiments, the buffer layer 116 is easily separated from the carrier 112 due to the debond layer 114. In some embodiments, the carrier 112 is detached from the buffer layer 116 through a debonding process, the carrier 112 and the debond layer 114 are removed, and the buffer layer 116 is exposed. In one embodiments, the debonding process is a laser debonding process. During the debonding step, a holding device TP is adopted to secure the package structures 10 before debonding the carrier 112 and the debond layer 114. As shown in FIG. 6, for example, the holding device TP may be an adhesive tape, a carrier film or a suction pad.

In some embodiments, the buffer layer 116 remained on redistribution layer 118 serves as a protection layer. Alternatively, in some embodiments, the buffer layer 116 may be subsequently removed, and a surface of the redistribution layer 118 may be exposed.

Figure 7:
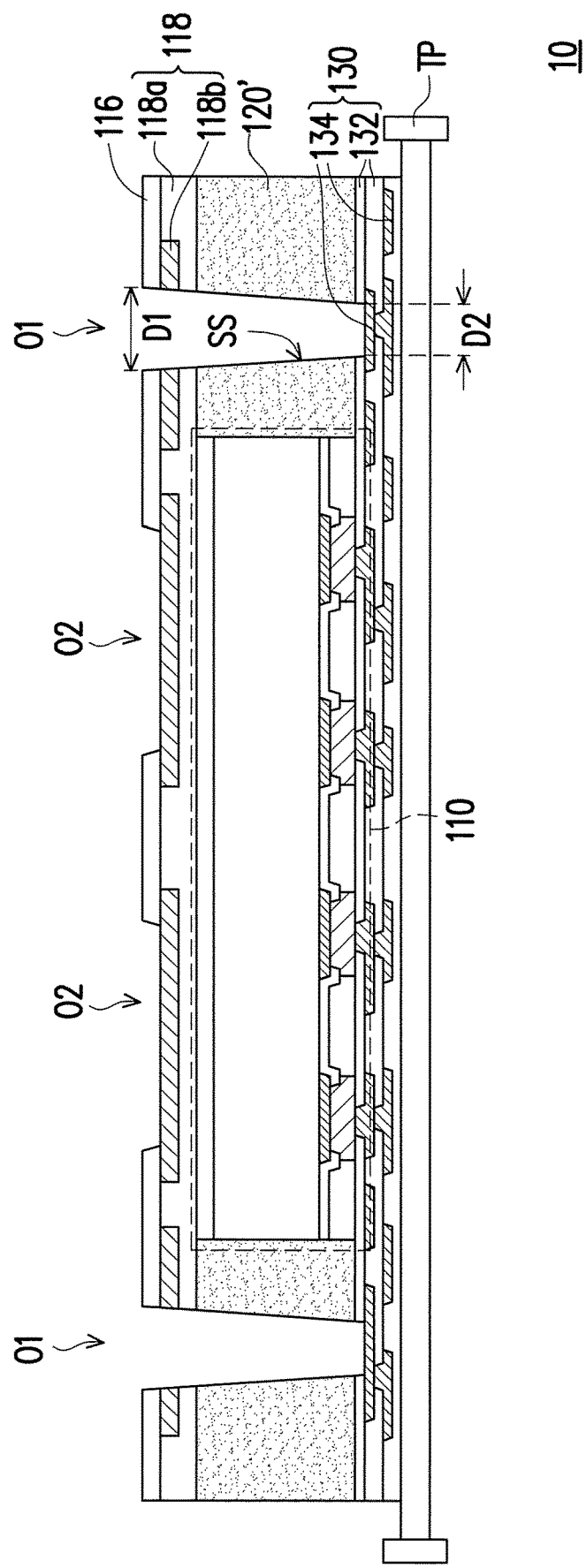

Referring to FIG. 7, in some embodiments, after removing the carrier 112 and the debond layer 114, trenches O1 are formed penetrating through the buffer layer 116, the redistribution layer 118 and the insulating encapsulation 120', and trenches O2 are formed in the buffer layer 116. In some embodiments, the trenches O1 and trenches O2 are, for example, formed by a laser drilling process. For example, in FIG. 7, only two trenches O1 and only two trenches O2 are shown, however the disclosure is not limited thereto. The number of the trenches O1 or trenches O2 may be one or more than one depending on the demand.

In certain embodiments, the trenches O1 penetrate through the buffer layer 116, the redistribution layer 118 and the insulating encapsulation 120' and penetrate into the redistribution layer 130 so as to expose portions of the topmost layer (depicted in FIG. 7) of the metallization layers 134 of the redistribution layer 130 respectively. In other words, the formation of the trenches O1 includes removing portions of the topmost polymer dielectric layer 132 (depicted in FIG. 7) of the redistribution layer 130 to partially expose the metallization layer 134 for further electrical connection. In some embodiments, the trenches O1 are located aside of and surround the semiconductor die 110, as shown in FIG. 7. In some embodiments, if considering the trench O1 is a hole with substantially round-shaped cross-section, each of the trenches O1 includes a slant sidewall SS, where each of the trenches O1 has a top opening having a diameter D1 and a bottom opening having a diameter D2, and the diameter D1 is greater than the diameter D2. In some embodiments, a ratio of the diameter D1 to the diameter D2 is about 0.5 to about 2. For example, in FIG. 7, for each trench O1, the top opening having the diameter D1 is located at the buffer layer 116 and the bottom opening having the diameter D2 is located at the redistribution layer 130. However, the cross-sectional shape of the trench O1 is not limited to be round and may be elliptical, oval, tetragonal, octagonal or any suitable polygonal shape, and the top opening of the trench O1 has a largest dimension larger than that of the bottom opening of the trench O1.

In some embodiments, as shown in FIG. 7, the trenches O2 are formed in the buffer layer 116, where portions of the metallization layer 118b of the redistribution layer 118 are respectively exposed by the trenches O2. In other words, a portion of the buffer layer 116 is removed to form the trenches O2. In one embodiment, the trenches O2 may be overlapped with the semiconductor die 110; however the disclosure is not limited thereto. In an alternative embodiment, the trenches O2 may not be overlapped with the semiconductor die 110. In an alternative embodiment, a portion of the trenches O2 may be overlapped with the semiconductor die 110, and the rest of the trenches O2 may not be overlapped with the semiconductor die 110.

In one embodiment, the trenches O1 may be formed prior to the formation of the trenches O2. In one embodiment, the trenches O2 may be formed prior to the formation the trenches O1. The disclosure is not limited thereto.

Figure 8:
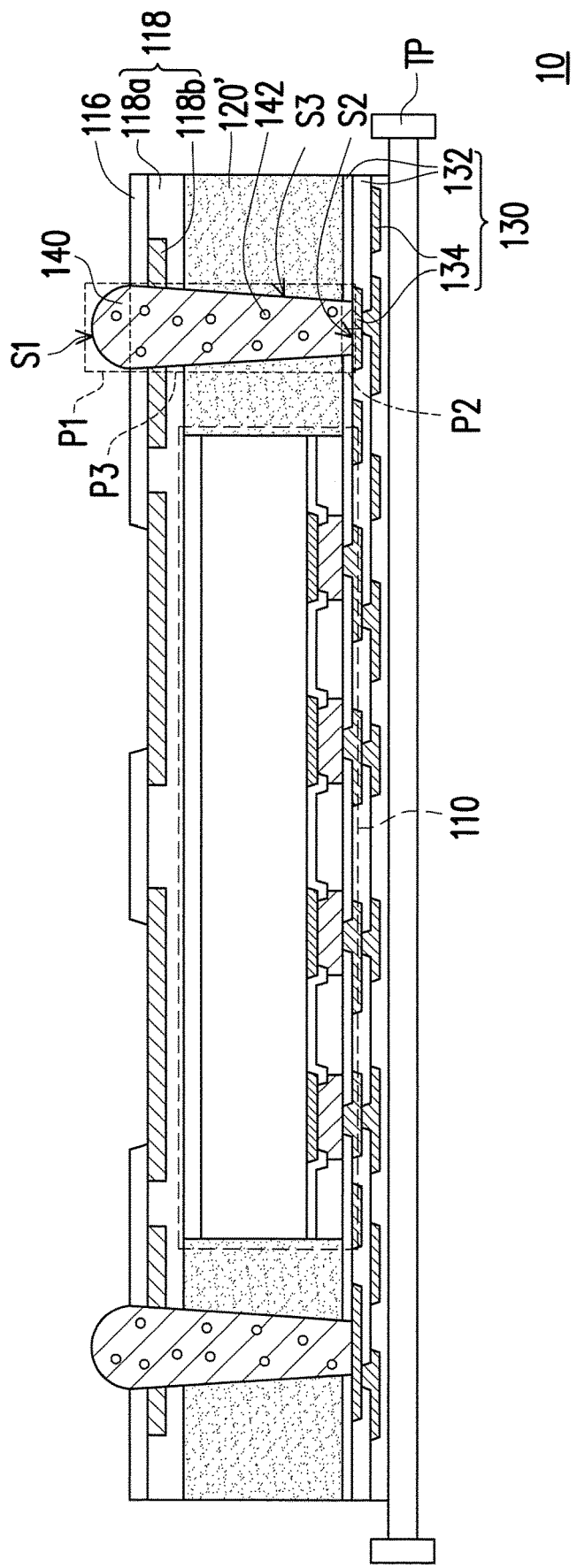

Referring to FIG. 8, in some embodiments, conductive structures 140 are respectively formed within the trenches O1, and are electrically connected to the redistribution layer 118 and the redistribution layer 130. In some embodiments, the conductive structures 140 are formed by filling the trenches O1 with a conductive paste (not shown) and curing the conductive paste to form the conductive structures 140. In one embodiment, the curing is performed at a curing temperature of about 120° C. to about 180° C. In one embodiment, the curing is performed under 160° C. for about one hour. In some embodiments, a material of the conductive paste includes Cu paste, Ag paste. In one embodiment, the conductive paste includes copper particles and/or copper alloy particles. In certain embodiments, the material of the conductive paste has a lower volume resistivity (i.e. lower than $10^{-6}$ ($\Omega$-m)) and acceptable linear thermal expansion coefficient (i.e. smaller than $10^{-4}$ (1/° C.)). Due to the conductive structures 140, the manufacturing cost is greatly reduced while the process time is decreased as well. Furthermore, as a resistance of the redistribution layer 118 and the redistribution layer 130 are much greater than a resistance of the conductive structures 140, the overall resistance of the redistribution layer 118, the redistribution layer 130 and the conductive structures 140 is substantially equivalent to an overall resistance of a redistribution layer(s) (having a resistance similar to the resistances of the redistribution layer 118 and the redistribution layer 130) and conventional conductive structures (formed by plating process), thereby an equivalent electrical performance is achieved in the disclosure as comparing to the conventional design involving the conductive structures formed by plating process. After curing, as shown in FIG. 8, each of the formed conductive structures 140 is a metallic pillar structure including a plurality of pores 142 evenly distributed therein (i.e. the number of the pores 142 presented per a unit volume of the conductive structure 140 is substantially the same). In some embodiments, each of the conductive structures 140 is protruded out of the trenches O1, and the protruded portion P1 has a first surface S1 (the top surface in FIG. 8 and FIG. 11, where FIG. 11 is an enlarged cross-sectional view of the conductive structures 140 depicted in FIG. 8) measuring from the top surface of the buffer layer 116; and each of the conductive structures 140 is further protruded into of the trenches O1, and the protruded portion P2 has a second surface S2 (the bottom surface in FIG. 8 and FIG. 11) opposite to the first surface S1 and contacting the topmost layer (depicted in FIG. 8) of the metallization layers 134 of the redistribution layer 130. In some embodiments, a third portion P3 connects the protruded portion P1 and the protruded portion P2 and has a sidewall S3. In other words, the sidewall S3 connects the first surface S1 and the second surface S2 as shown in FIG. 8 and FIG. 11.

As shown in FIG. 8, for example, the first surface S1 is a curved surface protruding away from a top surface of the buffer layer 116, and the second surface S2 is a planar surface mechanically and electrically connected to one of the metallization layers 134 of the redistribution layer 130 that is mechanically and electrically connected to the conductive pillars 110d (see FIG. 5) of the semiconductor die 110. In certain embodiments, as shown in FIG. 8 and FIG. 11, the diameter D1 of the conductive structure 140 (measuring at the top opening of the trench O1) is not equal to the diameter D2 of the conductive structure 140 (measuring at the bottom opening of the trench O1). In some embodiments, the ratio of the diameter D1 to the diameter D2 is about 0.5 to about 2. In some embodiments, the sidewall S3 is a slant sidewall, where a surface roughness of the sidewall S3 is about 1 μm to about 5 μm. In some embodiments, a maximum size W of the pores 142 is about 5 μm to about 20 μm. In certain embodiments, in each of the conductive structures 140, a volume percentage of the pores 142 occupied in the conductive structure 140 is approximately greater than 0% and less than or substantially equal to 20%. As shown in FIG. 8, some of the conductive structures 140 are electrically connected to the semiconductor die 110 through the redistribution layer 130. In some embodiments, the conductive structures 140 function as through molding vias or through encapsulant vias.

Figure 9:
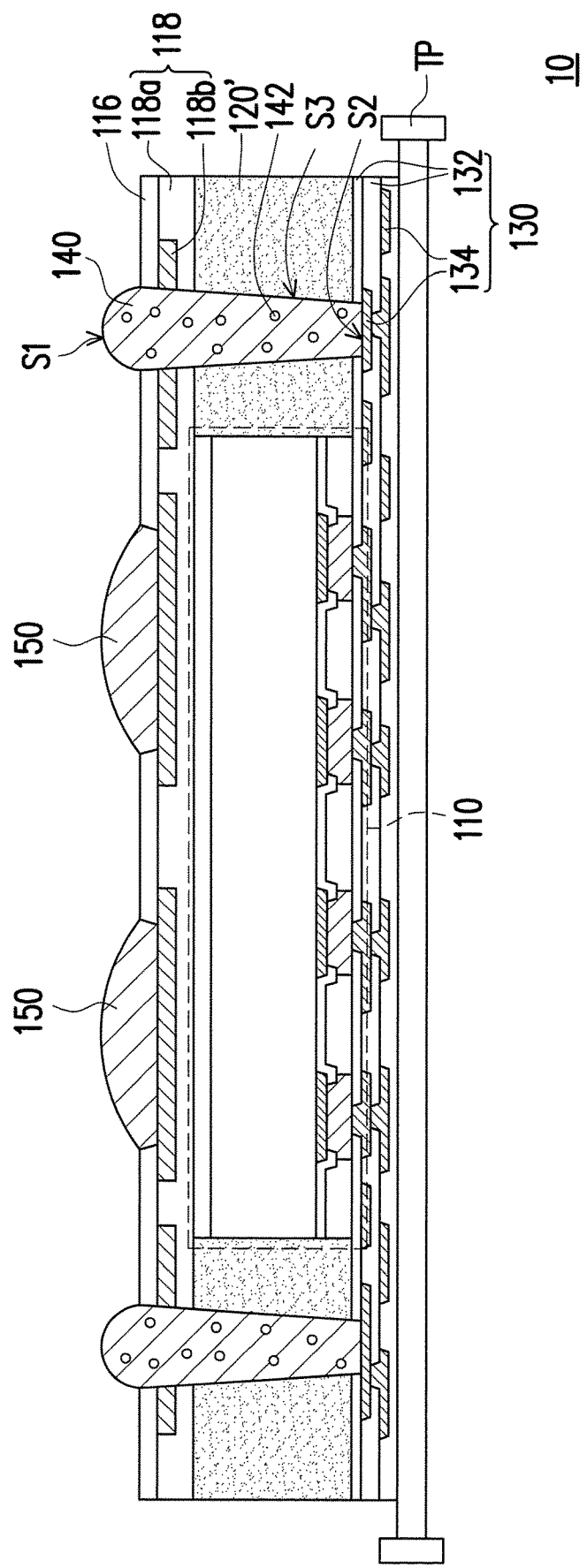

Referring to FIG. 9, in some embodiments, after the conductive structures 140 are formed, a plurality of conductive elements 150 are formed on the redistribution layer 118. As shown in FIG. 9, the conductive elements 150 are formed in the trenches O2 and disposed on the portions of the metallization layer 118b exposed by the trenches O2. In some embodiments, the conductive elements 150 may be formed by ball placement process or reflow process. In some embodiments, the conductive elements 150 are, for example, solder balls or ball grid array (BGA) balls. In some embodiments, the conductive elements 150 are mechanically and electrically connected to the redistribution layer 118. As shown in the FIG. 9, some of the conductive elements 150 are electrically connected to the semiconductor die 110 through the redistribution layer 118, the conductive structures 140, and the redistribution layer 130.

In some embodiments, additional semiconductor elements (e.g., passive components or active components) may be electrically connected to the semiconductor die through the conductive structures 140 and/or the conductive elements 150. In some embodiments, prior to the formation of the conductive elements 150, a plurality of under-ball metallurgy (UBM) patterns (not shown) may be formed on the metallization layer 118b exposed by the trenches O2 for electrically connecting the conductive elements 150 to the redistribution layer 118. In some embodiments, the material of the UBM patterns may include copper, nickel, titanium, tungsten, or alloys thereof or the like, and may be formed by an electroplating process, for example. The number and material of the UBM patterns are not limited in the disclosure.

Figure 10:
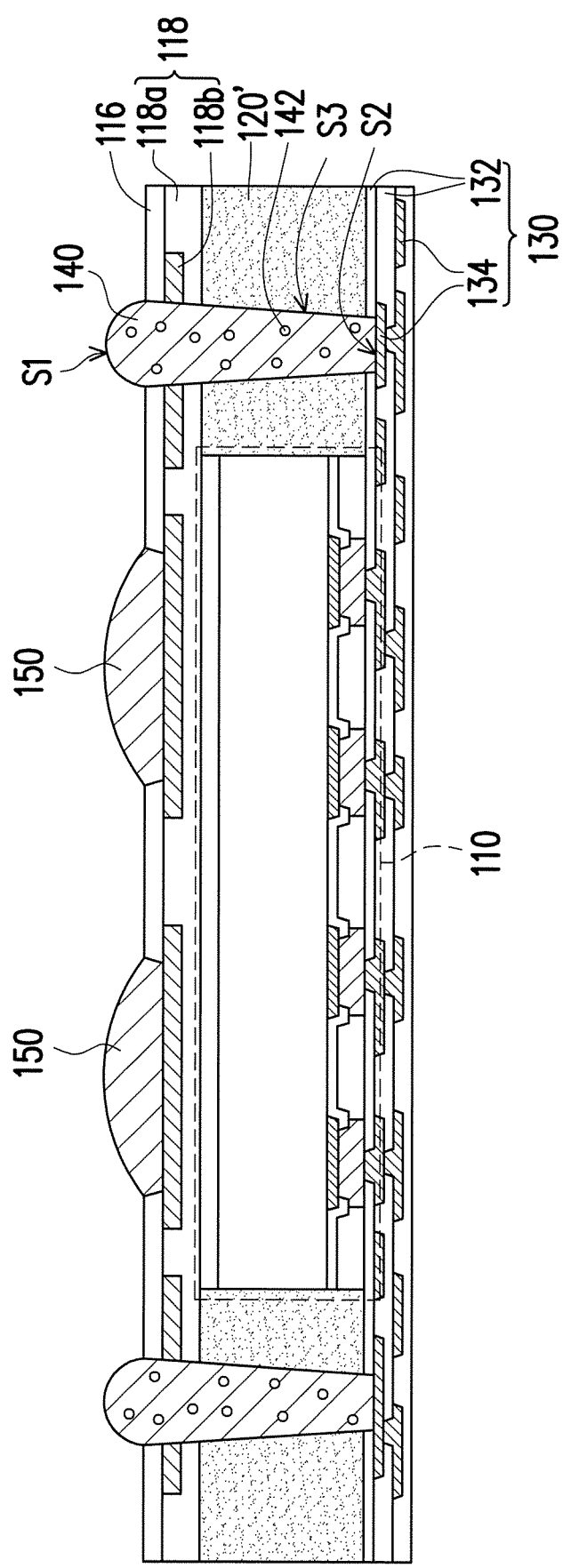
Figure 11:
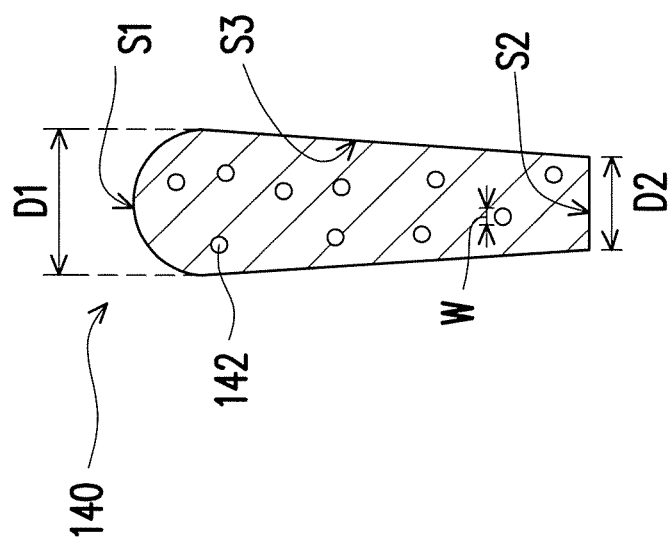
FIG. 11 is a schematic cross-sectional view of a conductive structure included in a package structure according to some exemplary embodiments of the present disclosure.

Referring to FIG. 10, in some embodiments, the redistribution layer 130 is released from the holding device TP to form the package structure 10. Up to here, the manufacture of the package structures 10 is completed.

In some embodiments, prior to releasing the redistribution layer 130 from the holding device TP, a dicing process is performed to cut the wafer having a plurality of the package structures 10 into individual and separated package structures 10. In one embodiment, the dicing process is a wafer dicing process including mechanical blade sawing or laser cutting.

FIG. 12 to FIG. 21 are schematic cross-sectional views of various stages in a manufacturing method of a package structure according to some exemplary embodiments of the present disclosure. FIG. 22 is a schematic cross-sectional view of a conductive structure included in a package structure according to some exemplary embodiments of the present disclosure. Referring to FIG. 1 to FIG. 10 and FIG. 12 to FIG. 21 together, the elements similar to or substantially the same as the elements described previously will use the same reference numbers, and certain details or descriptions of the same elements may not be repeated herein.

In FIG. 12 to FIG. 21, one die is shown to represent plural dies of the wafer, and a package structure 20 is shown to represent a package structure obtained following the manufacturing method, for example. In other embodiments, two chips or dies are shown to represent plural chips or dies of the wafer, and one or more package structures are shown to represent plural (semiconductor) package structures obtained following the (semiconductor) manufacturing method, the disclosure is not limited thereto.

Figure 12:
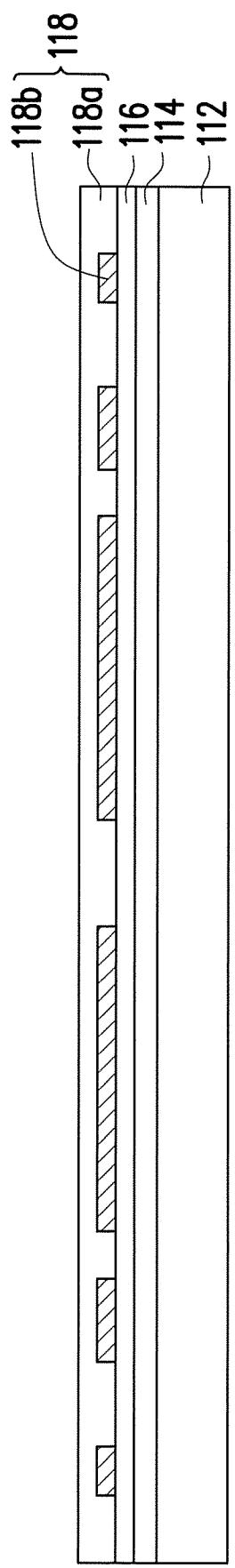
FIG. 12 to FIG. 21 are schematic cross-sectional views of various stages in a manufacturing method of a package structure according to some exemplary embodiments of the present disclosure.

Referring to FIG. 12, in some embodiments, a carrier 112 with a debond layer 114 and a buffer layer 116 coated thereon is provided. In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. As shown in FIG. 12, in some embodiments, the buffer layer 116 is disposed on the debond layer 114, and the debond layer 114 is located between the carrier 112 and the buffer layer 116. The top surface of the buffer layer 116 may be levelled and may have a high degree of coplanarity.

In some embodiments, as shown in FIG. 12, a redistribution layer 118 is formed over the carrier 112. For example, in FIG. 12, the redistribution layer 118 is formed on the buffer layer 116, and the formation of the redistribution layer 118 includes sequentially forming one or more polymer dielectric layers 118a and one or more metallization layers 118b in alternation. In some embodiments, the redistribution layer 118 includes one polymer dielectric layer 118a and one metallization layer 118b as shown in FIG. 12; however, the disclosure is not limited thereto. The numbers of the metallization layers and the polymer dielectric layers included in the redistribution layer 118 is not limited thereto. For example, the numbers of the metallization layers and the polymer dielectric layers may be one or more than one. Due to the configuration of the polymer dielectric layer 118a and the metallization layer 118b, a routing function is provided to the package structure 20. In certain embodiments, as shown in FIG. 12, the metallization layer 118b is disposed on the buffer layer 116 and covered by the polymer dielectric layer 118a.

Figure 13:
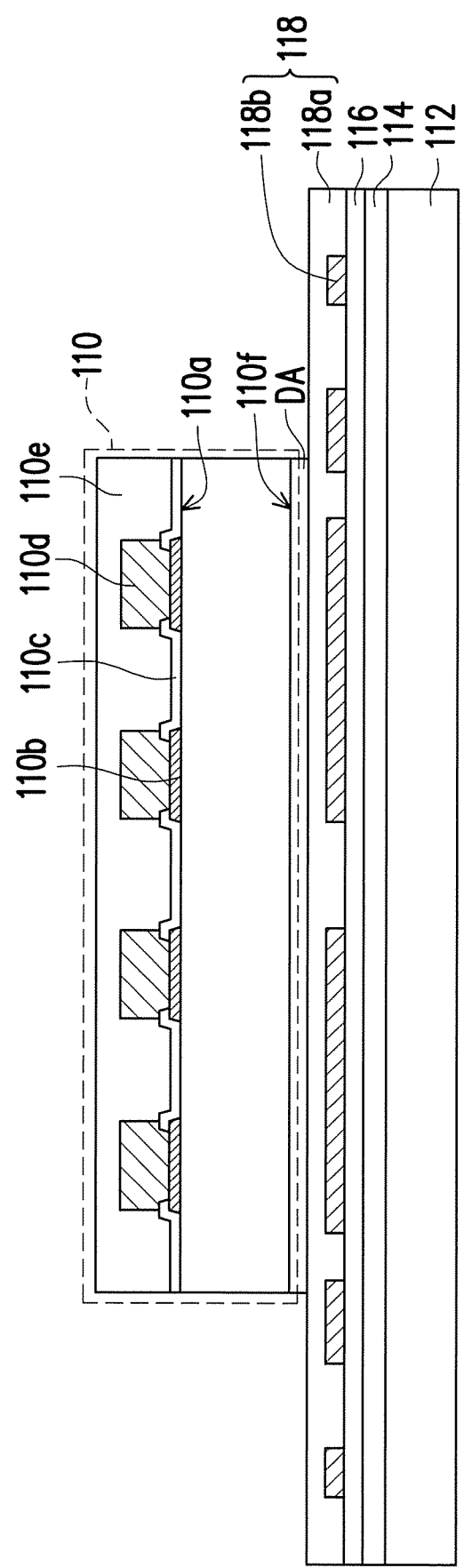

Referring to FIG. 13, in some embodiments, at least one semiconductor die 110 is provided. In some embodiments, the semiconductor die 110 is disposed on the redistribution layer 118 through a die attach film DA. In certain embodiments, the die attach film DA is first disposed on a backside 110f of the semiconductor die 110, then the semiconductor die 110 is attached to the redistribution layer 118 by placing the die attach film DA between the semiconductor die 110 and the redistribution layer 118. With the die attach film DA, a better adhesion between the semiconductor die 110 and the redistribution layer 118 is ensured. For example, in FIG. 13, the backside 110f of the semiconductor die 110 is stably adhered to the redistribution layer 118 through the die attach film DA provided between the semiconductor die 110 and the redistribution layer 118. In some embodiments, the redistribution layer 118 is referred as a back-side redistribution layer of the semiconductor die 110.

In some embodiments, the semiconductor die 110 includes an active surface 110a, a plurality of pads 110b distributed on the active surface 110a, a passivation layer 110c covering the active surface 110a and a portion of the pads 110b, a plurality of conductive pillars 110d connected to the portion of the pads 110b being exposed, a protection layer 110e, and the backside 110f opposite to the active surface 110a. As shown in FIG. 13, for example, the pads 110b are partially exposed by the passivation layer 110c, the conductive pillars 110d are disposed on and electrically connected to the pads 110b, and the protection layer 110e covers the passivation layer 110c and the conductive pillars 110d, as shown in FIG. 13. However, the disclosure is not limited thereto. In an alternative embodiment, the semiconductor die 110 may include the active surface 110a, the pads 110b distributed on the active surface 110a, the passivation layer 110c covering the active surface 110a and a portion of the pad 110b, and the backside surface 110f opposite to the active surface 110a. In some embodiments, the number of the semiconductor die 110 may be one or more than one, the disclosure is not limited thereto. In certain embodiments, the semiconductor die 110 may further include additional semiconductor die(s) of the same type or different types.

Figure 14:
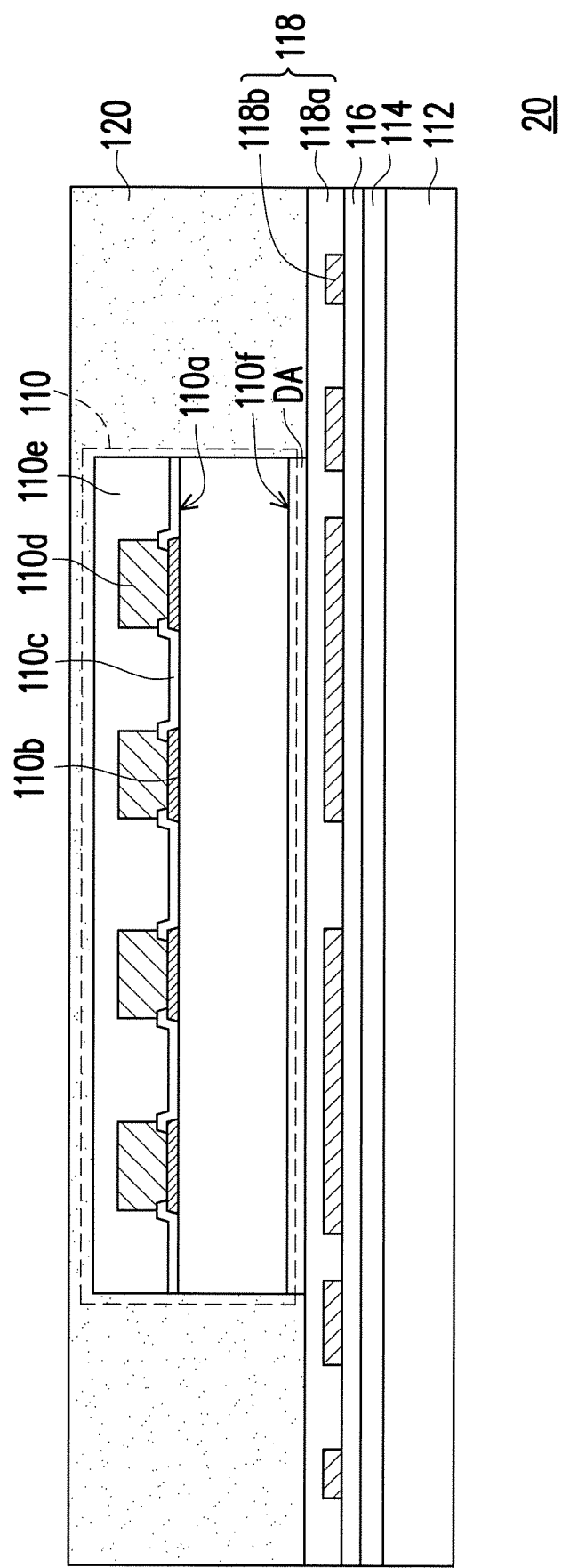

Referring to FIG. 14, in some embodiments, the semiconductor die 110 is encapsulated in the insulating encapsulation 120. In some embodiments, the insulating encapsulation 120 covers the semiconductor die 110, where the semiconductor die 110 are not accessibly revealed by the insulating encapsulation 120. In some embodiments, the insulating encapsulation 120 is formed over the semiconductor die 110 and the redistribution layer 118. For example, as shown in FIG. 14, the insulating encapsulation 120 covers the semiconductor die 110 and a surface of the redistribution layer 118 exposed by the semiconductor die 110. In other words, the insulating encapsulation 120 is over-molded over the semiconductor die 110 and the redistribution layer 118, where a height of the insulating encapsulation 120 is greater than a height of the semiconductor die 110. However, the disclosure is not limited thereto; in certain embodiments, a planarizing process may be performed to level the top surface of the semiconductor die and the insulating encapsulation.

Figure 15:
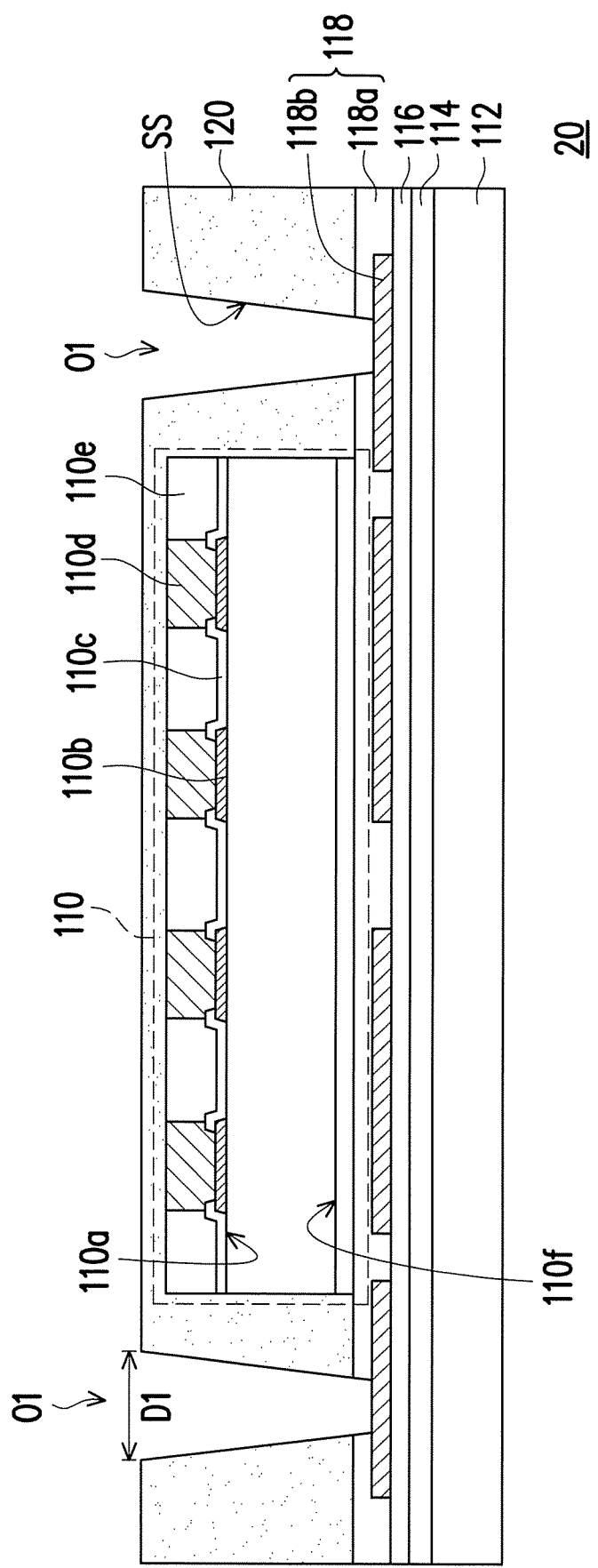

Referring to FIG. 15, in some embodiments, after forming the insulating encapsulation 120, trenches O1 are formed within the insulating encapsulation 120. For example, in FIG. 15, only two trenches O1 are shown, however the disclosure is not limited thereto. The number of the trenches O1 may be one or more than one depending on the demand.

In certain embodiments, the trenches O1 penetrate through the insulating encapsulation 120 and are at least partially formed in the redistribution layer 118 so as to expose portions of the metallization layers 118b of the redistribution layer 118 respectively. In other words, a portion of the redistribution layer 118 is removed to form the trenches O1. In some embodiments, the formation of the trenches O1 includes removing portions of the polymer dielectric layers 118a of the redistribution layer 118 to partially expose the metallization layer 118b for further electrical connection. In some embodiments, the trenches O1 are located aside of and surround the semiconductor die 110, as shown in FIG. 15. In some embodiments, if considering the trench O1 is a hole with substantially round-shaped cross-section, each of the trenches O1 includes a slant sidewall SS, where each of the trenches O1 has a top opening having a diameter D1 and a bottom opening having a diameter D2, and the diameter D1 is greater than the diameter D2. In some embodiments, a ratio of the diameter D1 to the diameter D2 is about 0.5 to about 2. For example, in FIG. 15, for each trench O1, the top opening having the diameter D1 is located at a side of the insulating encapsulation 120 near the active surface 110a of the semiconductor die 110 and the bottom opening having the diameter D2 is located at the redistribution layer 118 and near a side of the insulating encapsulation 120 away from the active surface 110a of the semiconductor die 110.

Figure 16:
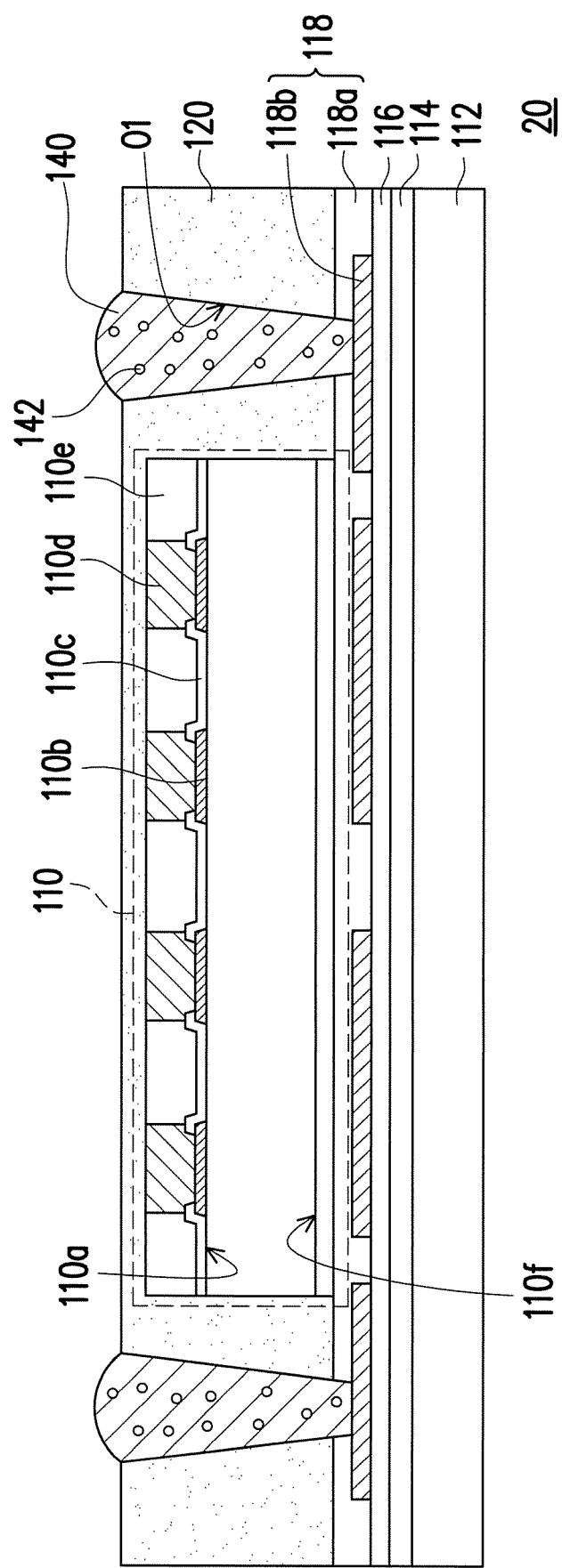

Referring to FIG. 16, in some embodiments, conductive structures 140 are respectively formed within the trenches O1, and are electrically connected to the redistribution layer 118. In some embodiments, the conductive structures 140 are formed by filling the trenches O1 with a conductive paste (not shown) and curing the conductive paste to form the conductive structures 140. In one embodiment, the curing is performed at a curing temperature of about 120° C. to about 180° C. In one embodiment, the curing is performed under 160° C. for about one hour. In some embodiments, a material of the conductive paste includes Cu paste, Ag paste. In one embodiment, the conductive paste includes copper particles and/or copper alloy particles. In certain embodiments, the material of the conductive paste has a lower volume resistivity (i.e. lower than $10^{-6}$ (Ω-m)) and acceptable linear thermal expansion coefficient (i.e. smaller than $10^{-4}$ (1/° C.)). After curing, as shown in FIG. 16, each of the formed conductive structures 140 is a metallic pillar structure including a plurality of pores 142 evenly distributed therein and protruding out of the insulating encapsulation 120.

Figure 17:
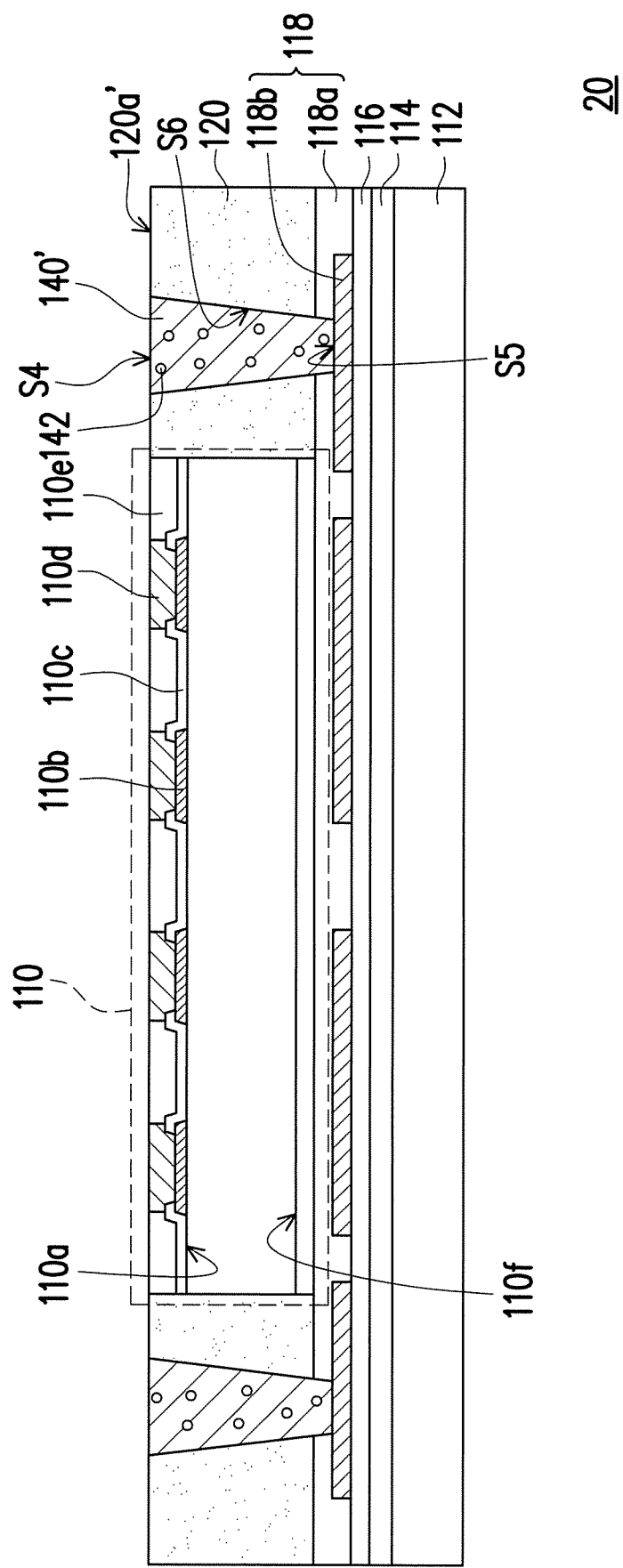

Referring to FIG. 17, in some embodiments, the insulating encapsulation 120 is planarized to form an insulating encapsulation 120' exposing the conductive pillars 110d and the protection layer 110e of the semiconductor die 110. In some embodiments, the insulating encapsulation 120 and a portion of the protection layer 110e of the semiconductor die 110 are planarized until top surfaces of the conductive pillars 110d of the semiconductor die 110 are exposed. During the planarizing step, the conductive pillars 110d of the semiconductor die 110 may also, for example, be partially removed. As shown in FIG. 17, for example, the top surfaces of the conductive pillars 110d and the protection layer 110e of the semiconductor die 110 are exposed by a top surface 120a' of the insulating encapsulation 120'. In certain embodiments, after the planarization, the top surfaces of the conductive pillars 110d and the protection layer 110e of the semiconductor die 110 become substantially levelled with the top surface 120a' of the insulating encapsulation 120'. In other words, the top surfaces of the conductive pillars 110d and the protection layer 110e of the semiconductor die 110 are coplanar to the top surface 120a' of the insulating encapsulation 120'.

During the planarizing process of the insulating encapsulation 120, the conductive structures 140 are also planarized to form conductive structures 140' including the pores 142 evenly distributed therein, where each of the conductive structures 140' has a first surface S4, a second surface S5 opposite to the first surface S4, and a sidewall S6 connecting the first surface S4 and the second surface S5. As shown in FIG. 17, for example, the first surface S4 is a planar surface that leveled with and coplanar to the top surface 120a' of the insulating encapsulation 120', and the second surface S2 is a planar surface mechanically and electrically connected to the metallization layer 118b of the redistribution layer 118. In certain embodiments, as shown in FIG. 17 and FIG. 22 (an enlarged cross-sectional view of the conductive structures 140 depicted in FIG. 17), the first surface S1 has the diameter D1 and the second surface S2 has the diameter D2, where the diameter D1 is not equal to the diameter D2. In some embodiments, the ratio of the diameter D1 to the diameter D2 is about 0.5 to about 2. In some embodiments, the sidewall S6 is a slant sidewall, where a surface roughness of the sidewall S6 is about 1 μm to about 5 μm. In some embodiments, a maximum size W of the pores 142 is about 5 μm to about 20 μm. In certain embodiments, in each of the conductive structures 140', a volume percentage of the pores 142 occupied in the conductive structure 140' is approximately greater than 0% and less than or substantially equal to 20%. As shown in FIG. 17, some of the conductive structures 140' are electrically connected to the redistribution layer 118.

In some embodiments, the insulating encapsulation 120, the conductive structure 140, and the conductive pillars 110d and the protection layer 110e of the semiconductor die 110 are planarized through a grinding process or a chemical CMP process. After the planarizing step, a cleaning step may be optionally performed, for example to clean and remove the residue generated from the planarizing step. However, the disclosure is not limited thereto, and the planarizing step may be performed through any other suitable method. The disclosure is not limited thereto.

Figure 18:
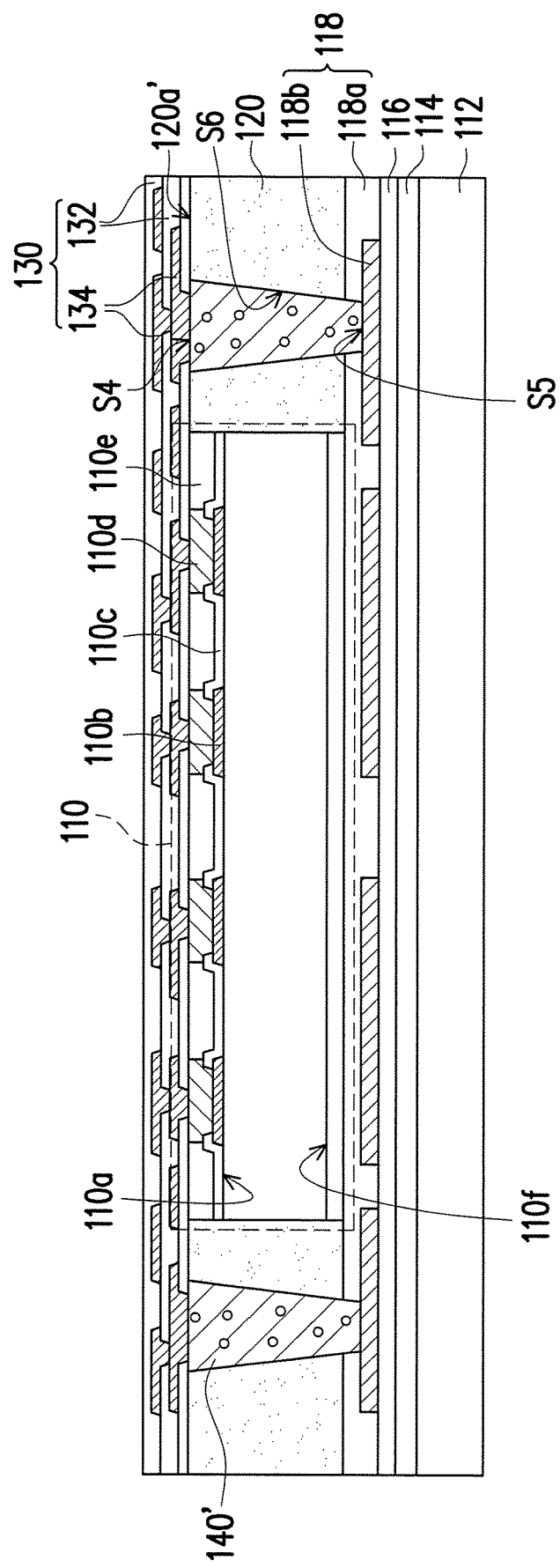

Referring to FIG. 18, in some embodiments, a redistribution layer 130 is formed over the carrier 112. In some embodiments, the redistribution layer 130 is formed on the top surfaces of the conductive pillars 110d and the protection layer 110e of the semiconductor die 110, the top surface 120a' of the insulating encapsulation 120', and the first surfaces S4 of the conductive structure 140'. In certain embodiments, the redistribution layer 130 is mechanically and electrically connected to the conductive pillars 110d of the semiconductor die 110 and the first surfaces S4 of the conductive structure 140', wherein the redistribution layer 130 provides a routing function for the semiconductor die 110. In some embodiments, the redistribution circuit structure 130 is a front-side redistribution layer electrically connected to the semiconductor die 110. As shown in FIG. 18, the redistribution layer 118 is electrically connected to the semiconductor die 110 through the conductive structure 140' and the redistribution layer 130.

The formation of the first redistribution layer 130 includes sequentially forming one or more polymer dielectric layers 132 and one or more metallization layers 134 in alternation. In certain embodiments, as shown in FIG. 5, the metallization layers 134 are sandwiched between the polymer dielectric layers 132, where the top surface of the topmost layer of the metallization layers 134 is covered by the topmost layer of the polymer dielectric layers 132 and the lowest layer of the metallization layers 134 is exposed by the lowest layer of the polymer dielectric layers 132 to connect the conductive pillars 110d of the semiconductor die 110. In one embodiment, the formation and material of the redistribution layer 130 may be the same as that of the redistribution layer 118. In an alternative embodiment, the formation and material of the redistribution layer 130 may be the different from that of the redistribution layer 118. Due to the conductive structures 140, the manufacturing cost is greatly reduced while the process time is decreased as well. Furthermore, as a resistance of the redistribution layer 118 and the redistribution layer 130 are much greater than a resistance of the conductive structures 140, the overall resistance of the redistribution layer 118, the redistribution layer 130 and the conductive structures 140 is substantially equivalent to an overall resistance of a redistribution layer(s) (having a resistance similar to the resistances of the redistribution layer 118 and the redistribution layer 130) and conventional conductive structures (formed by plating process), thereby an equivalent electrical performance is achieved in the disclosure as comparing to the conventional design involving the conductive structures formed by plating process.

Figure 19:
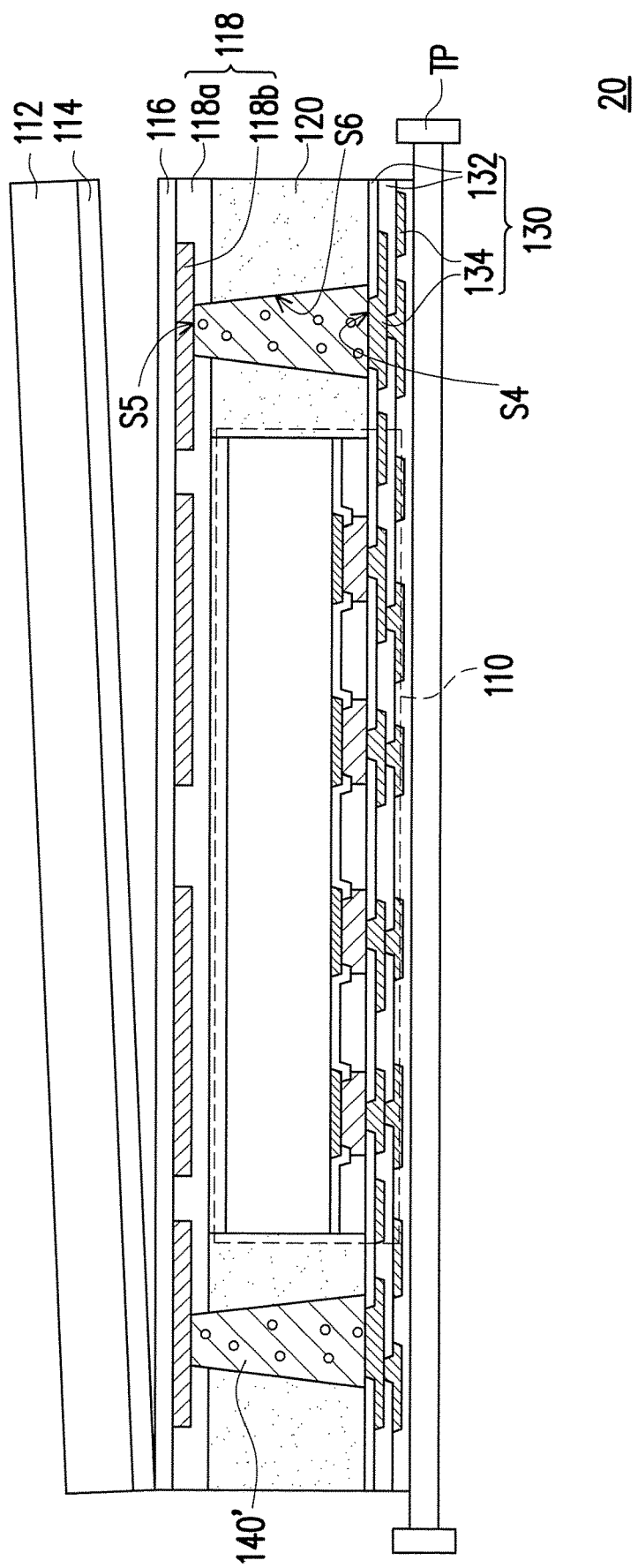

Referring to FIG. 19, in some embodiments, whole structure along with the carrier 112 is flipped (turned upside down), and then the carrier 112 is debonded from the buffer layer 116. In some embodiments, the buffer layer 116 is easily separated from the carrier 112 due to the debond layer 114. In some embodiments, the carrier 112 is detached from the buffer layer 116 through a debonding process, where the carrier 112 and the debond layer 114 are removed, and the buffer layer 116 is exposed. In one embodiments, the debonding process is a laser debonding process. During the debonding step, a holding device TP is adopted to secure the package structures 10 before debonding the carrier 112 and the debond layer 114. As shown in FIG. 19, for example, the holding device TP may be an adhesive tape, an carrier film or a suction pad.

In some embodiments, the buffer layer 116 remained on redistribution layer 118 serves as a protection layer. Alternatively, in some embodiments, the buffer layer 116 may be subsequently removed, and a surface of the redistribution layer 118 may be exposed.

Figure 20:
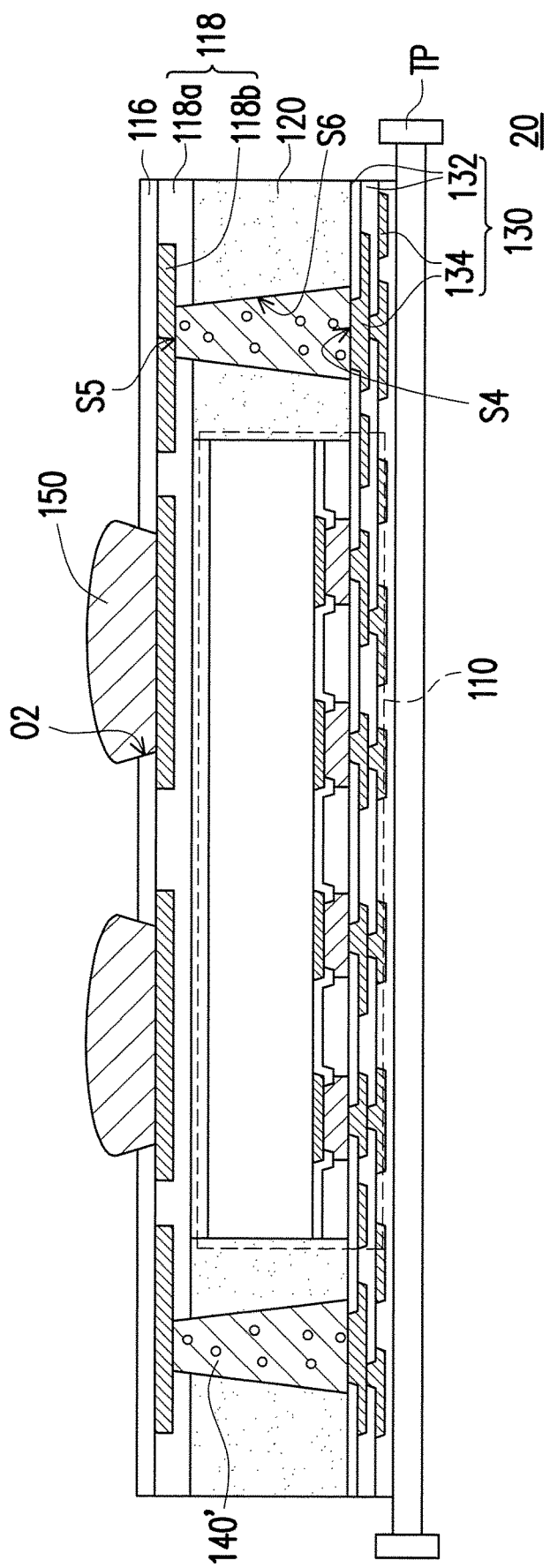

Referring to FIG. 20, in some embodiments, trenches O2 are formed in the buffer layer 116, where portions of the metallization layer 118b of the redistribution layer 118 are respectively exposed by the trenches O2. In other words, a portion of the buffer layer 116 is removed to form the trenches O2. In one embodiment, the trenches O2 may be overlapped with the semiconductor die 110; however the disclosure is not limited thereto. In an alternative embodiment, the trenches O2 may not be overlapped with the semiconductor die 110. In an alternative embodiment, a portion of the trenches O2 may be overlapped with the semiconductor die 110, and the rest of the trenches O2 may not be overlapped with the semiconductor die 110. For example, in FIG. 20, only two trenches O2 are shown, however the disclosure is not limited thereto. The number of the trenches O2 may be one or more than one depending on the demand.

Continued on FIG. 20, in some embodiments, a plurality of conductive elements 150 are formed on the redistribution layer 118. As shown in FIG. 20, the conductive elements 150 are formed in the trenches O2 and disposed on the portions of the metallization layer 118b exposed by the trenches O2. In some embodiments, the conductive elements 150 may be formed by ball placement process or reflow process. In some embodiments, the conductive elements 150 are, for example, solder balls or ball grid array (BGA) balls. In some embodiments, the conductive elements 150 are mechanically and electrically connected to the redistribution layer 118. As shown in the FIG. 20, some of the conductive elements 150 are electrically connected to the semiconductor die 110 through the redistribution layer 118, the conductive structures 140', and the redistribution layer 130.

In some embodiments, additional semiconductor elements (e.g., passive components or active components) may be electrically connected to the semiconductor die through the conductive elements 150. In some embodiments, prior to the formation of the conductive elements 150, a plurality of under-ball metallurgy (UBM) patterns (not shown) may be formed on the metallization layer 118b exposed by the trenches O2 for electrically connecting the conductive elements 150 to the redistribution layer 118. In some embodiments, the material of the UBM patterns may include copper, nickel, titanium, tungsten, or alloys thereof or the like, and may be formed by an electroplating process, for example. The number and material of the UBM patterns are not limited in the disclosure.

Figure 21:
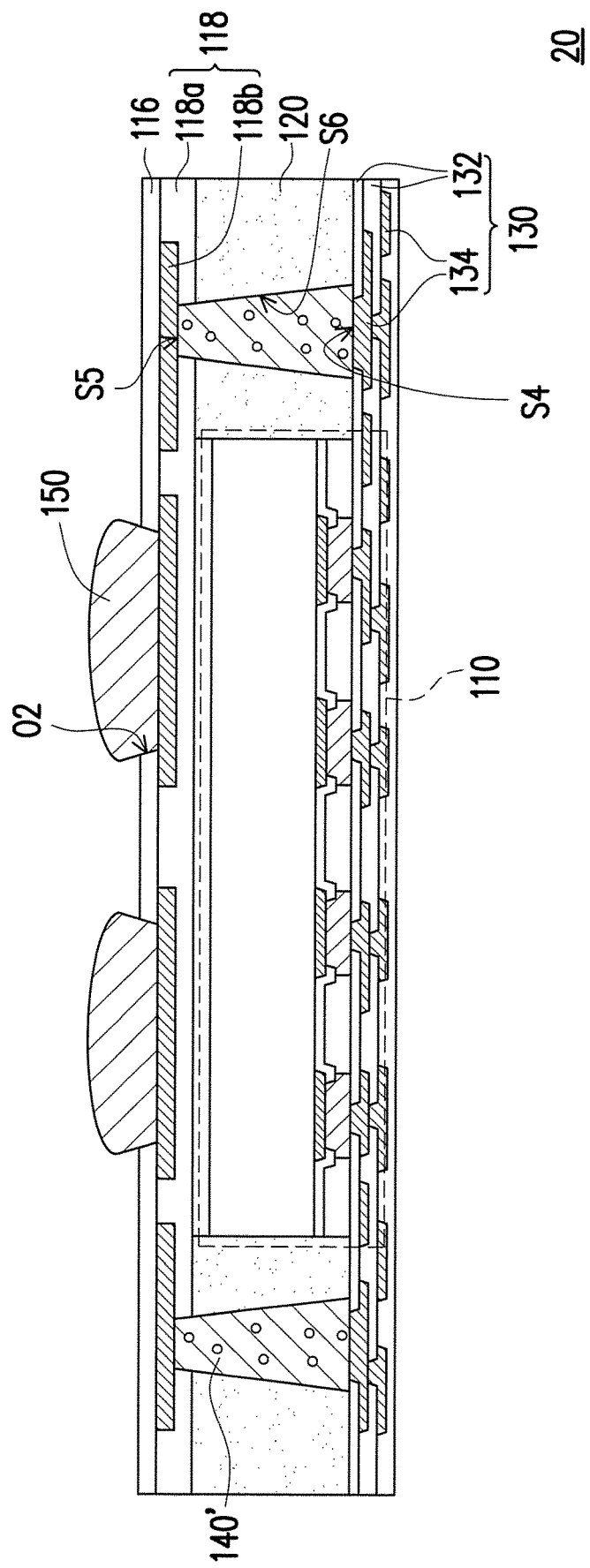
Figure 22:
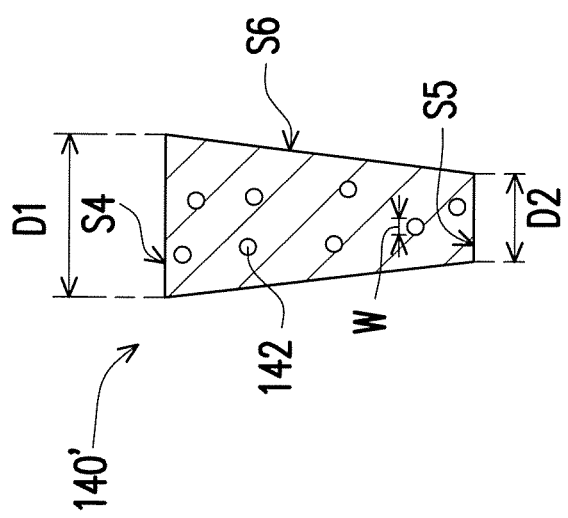
FIG. 22 is a schematic cross-sectional view of a conductive structure included in a package structure according to some exemplary embodiments of the present disclosure.

Referring to FIG. 21, in some embodiments, the redistribution layer 130 is released from the holding device TP to form the package structure 20. Up to here, the manufacture of the package structures 20 is completed.

In some embodiments, prior to releasing the redistribution layer 130 from the holding device TP, a dicing process is performed to cut the wafer having a plurality of the package structures 20 into individual and separated package structures 20. In one embodiment, the dicing process is a wafer dicing process including mechanical blade sawing or laser cutting.

According to some embodiments, a package structure includes an insulating encapsulation, at least one die, and conductive structures. The at least one die is encapsulated in the insulating encapsulation. The conductive structures are located aside of the at least one die and surrounded by the insulating encapsulation, and at least one of the conductive structures is electrically connected to the at least one die. Each of the conductive structures has a first surface, a second surface opposite to the first surface and a slant sidewall connecting the first surface and the second surface, and each of the conductive structures has a top diameter greater than a bottom diameter thereof, and wherein each of the conductive structures has a plurality of pores distributed therein.

According to some embodiments, a package structure includes a first redistribution layer, a second redistribution layer, at least one die, an insulating encapsulation, and conductive structures. The at least one die is located between and electrically connected to the first redistribution layer and the second redistribution layer, and encapsulated in an insulating encapsulation. The conductive structures are located aside of the at least one die and at least partially covered by the insulating encapsulation, wherein the conductive structures are electrically connected to the first redistribution layer and the second redistribution layer, and penetrate through the insulating encapsulation. Each of the conductive structures has a first portion and a second portion opposite to the first portion, the first portion of each of the conductive structures protrudes out of the first redistribution layer, and the second portion of each of the conductive structures is in the second redistribution layer.

According to some embodiments, a manufacturing method of a package structure is provided with the following steps: providing a carrier; forming a first redistribution layer on the carrier; disposing at least one die on the first redistribution layer; forming an insulating encapsulation to cover the at least one die; drilling first trenches in the insulating encapsulation; filling the first trenches with a conductive paste to form conductive structures, wherein each of the conductive structures has a plurality of pores distributed therein and a top diameter of each of the conductive structures is greater than a bottom diameter of each of the conductive structures; and forming a second redistribution layer on the at least one die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
an insulating encapsulation;
at least one die, encapsulated in the insulating encapsulation, wherein a sidewall of the at least one die is in contact with the insulating encapsulation;
conductive structures, located aside of the at least one die and surrounded by the insulating encapsulation, and at least one of the conductive structures being electrically connected to the at least one die;
conductive terminals, disposed on a rear side of the at least one die, electrically coupled to the at least one die, and free from the insulating encapsulation, wherein positioning locations of the conductive terminals are within a positioning location of the at least one die, and the conductive terminals are laterally surrounded by the conductive structures in a vertical projection in a stacking direction of the conductive terminals and the at least one die; and
a first redistribution layer, disposed on the at least one die, wherein the conductive structures are in direct contact with a first metallization layer of the first redistribution layer,
wherein each of the conductive structures has a first surface, a second surface opposite to the first surface and a slant sidewall connecting the first surface and the second surface, and each of the conductive structures has a top diameter greater than a bottom diameter thereof,
wherein each of the conductive structures has a plurality of pores distributed therein.

2. The package structure of claim 1, wherein the first surface of the each of the conductive structures is a planar surface, and the first surface of the each of the conductive structures is levelled with and coplanar to an active surface of the at least one die.

3. The package structure of claim 1, wherein the conductive structures penetrate and are electrically connected to the first redistribution layer, and the first surface of the each of the conductive structures is a curved surface and protrudes out of the first redistribution layer.

4. The package structure of claim 1,
wherein the first redistribution layer is disposed between the at least one die and the conductive terminals in the stacking direction and in contact with the insulating encapsulation, wherein the conductive terminals are electrically coupled to the at least one die through the first redistribution layer and the conductive structures.

5. The package structure of claim 1, further comprising:
a second redistribution layer, disposed over the insulating encapsulation and electrically connected to the at least one die, wherein the insulating encapsulation is disposed between the first redistribution layer and the second redistribution layer, wherein the conductive structures are electrically connected to the at least one die through the second redistribution layer.

6. The package structure of claim 5, wherein the conductive structures further extends into the second redistribution layer and in direct contact with a second metallization layer of the second redistribution layer.

7. The package structure of claim 1, wherein a thickness of the conductive structures is greater than a thickness of the at least one die in the stacking direction.

8. A package structure, comprising:
a first redistribution layer and a second redistribution layer;
a semiconductor die, located between and electrically connected to the first redistribution layer and the second redistribution layer;
a conductive structure, located between and electrically connected to the first redistribution layer and the second redistribution layer, and located aside of and electrically connected to the semiconductor die, wherein the conductive structure has a first surface with a top diameter, a second surface with a bottom diameter opposite to the first surface and a slant sidewall connecting the first surface and the second surface, and the top diameter is greater than the bottom diameter, wherein the conductive structure has a plurality of pores distributed therein, wherein the conductive structure is in direct contact with a first metallization layer of the first redistribution layer;
an insulating encapsulation, encapsulating the semiconductor die and surrounding the conductive structure, wherein a sidewall of the semiconductor die is in contact with the insulating encapsulation; and
conductive terminals, disposed on a rear side of the semiconductor die, electrically coupled to the semiconductor die, and free from the insulating encapsulation, wherein positioning locations of the conductive terminals are within a positioning location of the semiconductor die, and the conductive terminals are laterally surrounded by the conductive structure in a vertical projection in a stacking direction of the conductive terminals and the semiconductor die.

9. The package structure of claim 8, wherein the first surface is located between the first redistribution layer and the second redistribution layer along a stacking direction of the first redistribution layer, the semiconductor die and the second redistribution layer.

10. The package structure of claim 8, wherein the first redistribution layer is located between the first surface and the second redistribution layer along a stacking direction of the first redistribution layer, the semiconductor die and the second redistribution layer.

* * * * *